United States Patent [19]

Manning

[11] Patent Number: 5,298,792
[45] Date of Patent: Mar. 29, 1994

[54] INTEGRATED CIRCUIT DEVICE WITH BI-LEVEL CONTACT LANDING PADS

[75] Inventor: Monte Manning, Kuna, Id.
[73] Assignee: Micron Technology, Inc., Boise, Id.
[21] Appl. No.: 829,920
[22] Filed: Feb. 3, 1992
[51] Int. Cl.$^5$ .............. H01L 23/48; H01L 23/46; H01L 29/62; H01L 29/54
[52] U.S. Cl. .................. 257/758; 257/756; 257/781
[58] Field of Search .......... 257/758, 756, 759, 754, 257/781

[56] References Cited

U.S. PATENT DOCUMENTS

| | | | |
|---|---|---|---|
| 3,921,282 | 11/1975 | Cunningham et al. | 257/758 |
| 4,500,906 | 2/1985 | Ohno et al. | 257/758 |
| 4,544,941 | 10/1985 | Ariizumi et al. | 257/758 |
| 4,617,193 | 10/1986 | Wu | 257/758 |
| 4,733,289 | 3/1988 | Tsurumaru | 257/759 |
| 4,961,104 | 10/1990 | Hirakawa | 257/756 |

*Primary Examiner*—Rolf Hille
*Assistant Examiner*—S. V. Clark
*Attorney, Agent, or Firm*—Dorr, Carson, Sloan & Peterson

[57] ABSTRACT

A semiconducting wafer has an active area and first and second field oxide regions adjacent opposite sides of the active area. A first poly layer is deposited to form a first landing pad member electrically contacting the active area and overlapping the first field oxide region. Then an insulating oxide layer is deposited, followed by a second poly layer to form a second landing pad member overlapping the first landing pad member and the second field oxide region. A contact etch is performed with the landing pad members acting as an etch stop. A contact is deposited to electrically contact the landing pad members.

15 Claims, 4 Drawing Sheets

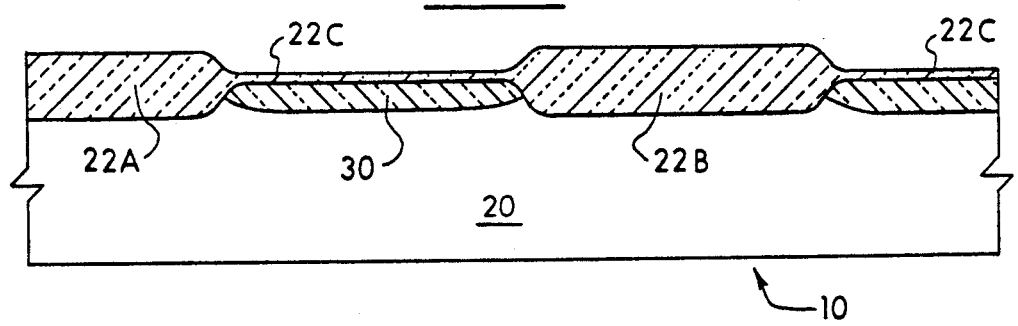
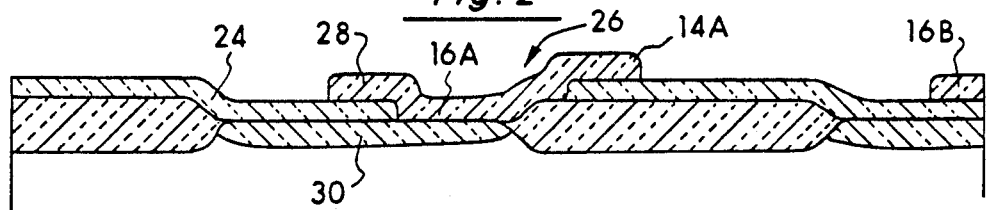
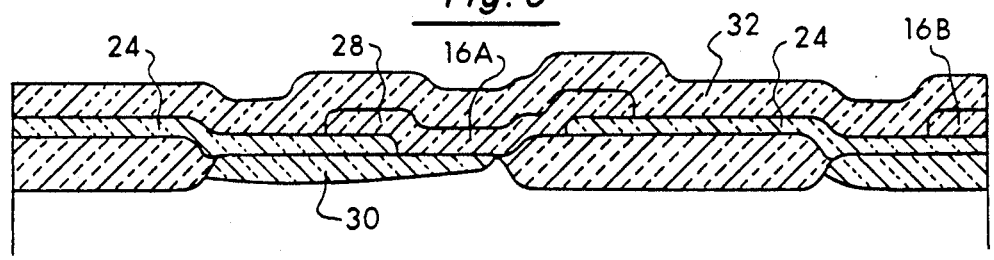
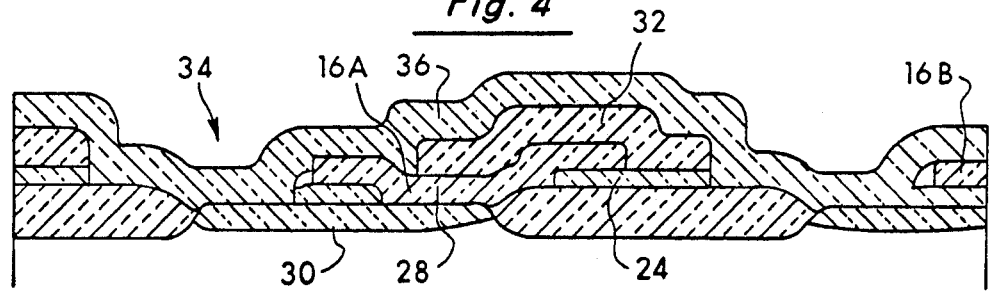
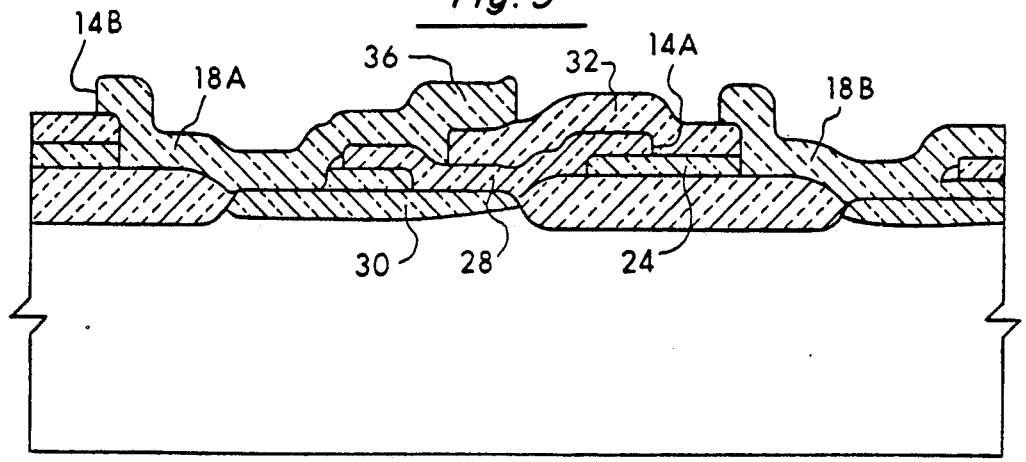

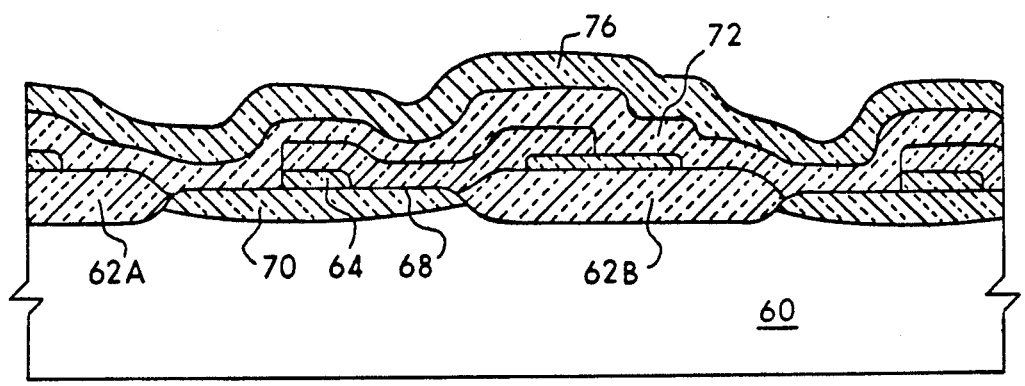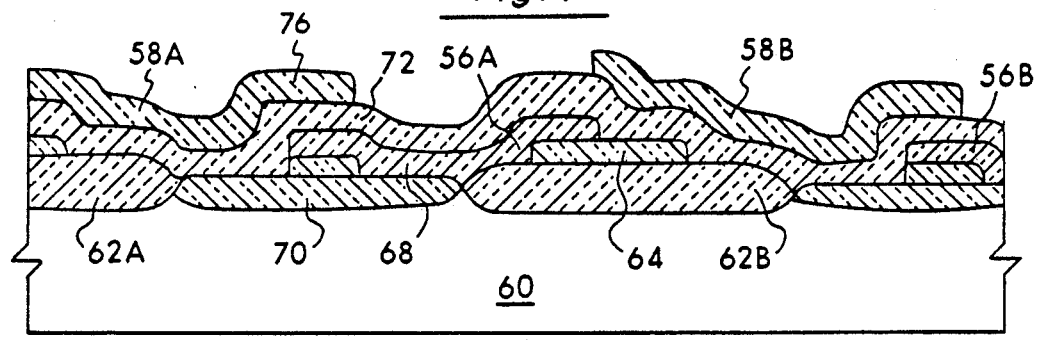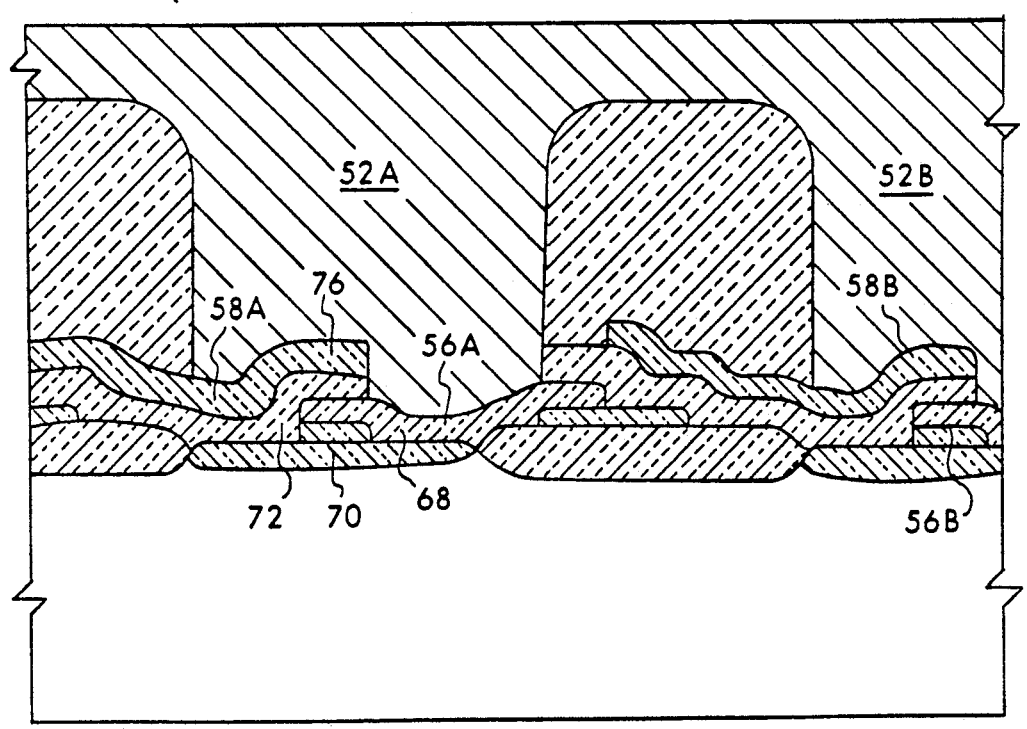

INTEGRATED CIRCUIT DEVICE WITH BI-LEVEL CONTACT LANDING PADS

BACKGROUND OF THE INVENTION

1. Field of the Invention

The invention in general relates to fabrication of integrated circuits and more particularly to the structure and process of fabricating landing pads for contacts in such circuits.

2. Statement of the Problem

As is well-known, integrated circuits, sometimes called semiconductor devices, are generally mass produced by fabricating hundreds of identical circuit patterns on a single semiconducting wafer, which wafer is subsequently sawed into hundreds of identical dies or chips. While integrated circuits are commonly referred to as "semiconductor devices" they are in fact fabricated from various materials which are either electrically conductive, electrically nonconductive, or electrically semiconductive. Silicon, the most commonly used semiconductor material, can be used in either the single crystal or polycrystalline form. In the integrated circuit fabrication art, polycrystalline silicon is usually called "polysilicon" or simply "poly", and shall be referred to as such herein. Both forms of silicon may be made conductive by adding impurities to it, which is commonly referred to as "doping". If the doping is with an element such as boron which has one less valence electron than silicon, electron "holes" become the dominant charge carrier and the doped silicon is referred to as P-type silicon. If the doping is with an element such as phosphorus which has one more valence electron than silicon, additional electrons become the dominant charge carriers and the doped silicon is referred to as N-type silicon. Silicon dioxide is also commonly used in integrated circuits as an insulator or dielectric. Its use is so common that in the art is generally referred to as "oxide" without ambiguity.

CMOS (Complimentary Metal Oxide Semiconductor) technology is currently the most commonly used integrated circuit technology, and thus the present invention will be described in terms of silicon-based CMOS technology, although it is evident that it will find uses in other integrated circuit technologies. The term CMOS is now loosely applied to mean any integrated circuit in which both N-channel and P-channel MOSFETs (Metal-Oxide-Semiconductor Field Effect Transistors) are used in a complimentary fashion. CMOS integrated circuit fabrication may begin with a lightly-doped P-type silicon substrate, a lightly-doped N-type silicon substrate, or lightly-doped epitaxial silicon (deposited crystalline silicon) on a heavily doped substrate. For the sake of simplicity, the invention will be described using lightly-doped P-type silicon as the starting material, although it may be implemented with other materials as the starting point. If other materials are used as the starting point, there may be differences in materials and structure as is well-known in the art, e.g. with N-type silicon as the starting point dopant types may be reversed, or P-type wells may be introduced.

The advantages of building integrated circuits with smaller individual circuit elements so that more and more circuitry may be packed on a single chip are well-known: electronic equipment becomes less bulky, reliability is improved by reducing the number of solder or plug connections, assembly and packaging costs are minimized, and improved circuit performance, in particular higher clock speeds. However, the smaller the size, the more difficult it is to fabricate and locate individual parts, such as contacts, within the specifications and tolerances required. SRAM (Static Random Access Memory) is one of the most densely-packed integrated circuits commonly manufactured today. Thus the problems associated with small size are especially acute in SRAM.

An area in a integrated circuit to which electrical connection is to be made is generally called an active area (AA). Current integrated circuit technology often includes an intermediate doped semiconductor layer between an AA and the metal contact which connects the active area to an electrical source. This intermediate layer is called a contact landing pad or landing pad. In memories and other structures requiring densely packed contacts, landing pads are conventionally fabricated by creating a photolithographic mask containing the pattern of the parts to be fabricated, coating the wafer with a light-sensitive material called photoresist or resist, exposing the resist-coated wafer to ultraviolet light through the mask to soften or harden parts of the resist depending on whether positive or negative resist is used, removing the softened parts of the resist, etching the wafer to remove the part unprotected by the resist, and stripping the remaining resist. In each of these steps from mask, to photoresist, to etched wafer, critical dimension loss (CD loss) may occur. For example, in CMOS 4M SRAM with 0.8 $\mu$m contacts and 0.2 $\mu$m misalignment tolerance, a typical landing pad must be 1.2 $\mu$m $\times$ 1.2 $\mu$m. When CD loss due to the etch of the landing pad material is factored in, the CD in resist may go to 1.4 $\mu$m $\times$ 1.4 $\mu$m, assuming 0.1 $\mu$m loss per edge. In a cell requiring 1.8 $\mu$m contact pitch, this leaves a 0.4 $\mu$m space between landing pads. This is very difficult with some conventional steppers Thus there is a need for a structure and fabrication process that can provide landing pads large enough to handle the required contacts that can be fabricated close enough together to meet the contact pitch requirements for state-of-the-art SRAM, and yet can be consistently fabricated with conventional steppers.

The business of fabricating semiconductor devices is a very competitive, high-volume business. Thus manufacturing efficiency is highly important. Product quality and reliability are also highly important. It is well-known in the art that increasing the number of levels in the integrated circuit not only increases manufacturing costs and time but also generally decreases the quality and reliability of the end product, since the opportunities for disabling defects to occur are increased. This in turn feeds back into further increased manufacturing costs since scrapped product is increased at the same time as the cost of individual scrapped pieces is increased. Thus, a structure and process that not only permits small contact pitch landing pads to be fabricated with conventional equipment, but also does not add to the number of levels in the fabrication process, would therefore be highly desirable.

3. Solution to the problem

The present invention provides an integrated circuit design in which two different levels in the fabrication process are "teamed" together to form the landing pads. The invention uses two fabrication levels or layers that may already be available in the integrated circuit fabrication process.

According to the invention first landing pad members are formed in one fabrication layer, and second landing pad members are formed in another layer. Each of the first landing pad members is smaller than the desired size for the whole landing pad, thus the members can be sufficiently separated so that they can be formed using conventional fabrication equipment. Likewise for the second landing pad members. The landing pad members are patterned so that each of the second landing pad members overlaps and "teams" with a first landing pad member to form the larger desired landing pad.

SUMMARY OF THE INVENTION

The invention provides an integrated circuit comprising: a semiconductor having an active area; a contact landing pad; contact means for contacting the landing pad, the contact means defining a contact plane; and the contact landing pad comprising: a first landing pad member formed in a first fabrication layer; and a second landing pad member formed in a second fabrication layer; and wherein at least one of the first and second landing pad members contacts the active area, the first contact landing pad member partially overlaps the second landing pad member in a plane parallel to the contact plane, and the combined landing pad area of the first and second landing pad members is as large as or larger than the area required for a contact landing pad in the integrated circuit. Preferably, the integrated circuit further comprises a third fabrication layer between the first and second fabrication layers, which third layer is preferably an insulating layer. Preferably, the landing pad provides an etch stop for a contact etch process. In one embodiment the first landing pad member is electrically insulated from the second landing pad member. In another embodiment the second landing pad member electrically contacts the first landing pad member through the insulating layer. In a further embodiment the first landing pad member contacts the active area and the second landing pad member contacts the active area and the first landing pad member. Preferably, the integrated circuit further includes a field oxide layer adjacent the active area, and the landing pad extends over the field oxide to protect it from damage during a contact etch process. Preferably, the first landing pad member is fabricated from a first layer of doped polysilicon and the second landing pad member is fabricated from a second layer of doped polysilicon. Preferably, the integrated circuit further includes a silicon dioxide layer between the first layer of polysilicon and the second layer of polysilicon.

The invention also provides a method of fabricating an integrated circuit comprising the steps of: providing a semiconductor having an active area defining a plane; forming a first landing pad member while creating a first polysilicon layer and a second landing pad member while creating a second poly layer, the second landing pad member partially overlapping the first landing pad member in a plane parallel to the active area plane and at least one of the first and second landing pad members contacting the active area; performing a contact etch to define the boundaries of a contact, the first and second landing pad members acting as an etch stop for the contact etch; and depositing a contact layer to form a contact in electrical contact with the first and second landing pad members. Preferably, the step of forming comprises: forming the first landing pad member; forming an insulating layer at least partially covering the first landing pad member; and forming a second landing pad member at least partially covering the insulating layer.

The invention permits landing pads of a size and spacing that previously could not be fabricated on conventional equipment to be fabricated with such equipment. Numerous other features, objects and advantages of the invention will become apparent from the following description when read in conjunction with the accompanying drawings.

BRIEF DESCRIPTION OF THE DRAWINGS

FIG. 1 is a cross-sectional view of a semiconductor wafer, with a semiconducting substrate and field oxide regions, upon which the preferred embodiment of the invention is fabricated;

FIG. 2 is a cross-sectional view of the wafer of FIG. 1 on which a first oxide layer has been deposited, a first level of exhumed contacts have been patterned, and a first poly layer has been deposited and patterned;

FIG. 3 is a cross-sectional view of the wafer of FIG. 2 on which an interpoly dielectric has been deposited;

FIG. 4 is a cross-sectional view of the wafer of FIG. 3 on which a second level of exhumed contacts have been patterned, and a second poly layer has been deposited;

FIG. 5 is a cross-sectional view of the wafer of FIG. 4 in which the second poly layer has been patterned;

FIG. 8 is a cross-sectional view of a wafer according to an alternative embodiment of the invention after the second poly layer has been deposited;

FIG. 9 is a cross-sectional view of the wafer of FIG. 8 in which the second poly layer has been patterned;

FIG. 10 is a cross-sectional view of the wafer of FIG. 9 after a dielectric has been deposited and the contacts have been patterned.

DESCRIPTION OF THE PREFERRED EMBODIMENT

1. Overview

Figure 6:
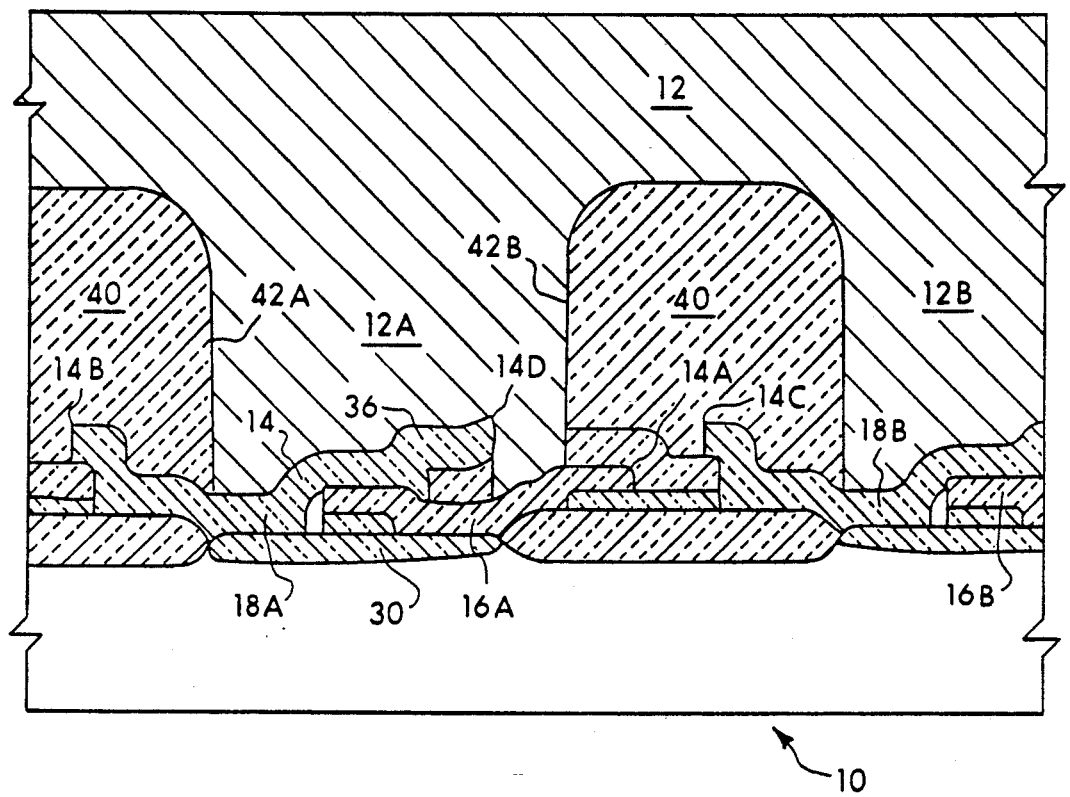
FIG. 6 is a cross-sectional view of the wafer of FIG. 5 on which a dielectric has been deposited and contacts have been patterned.
Figure 7:
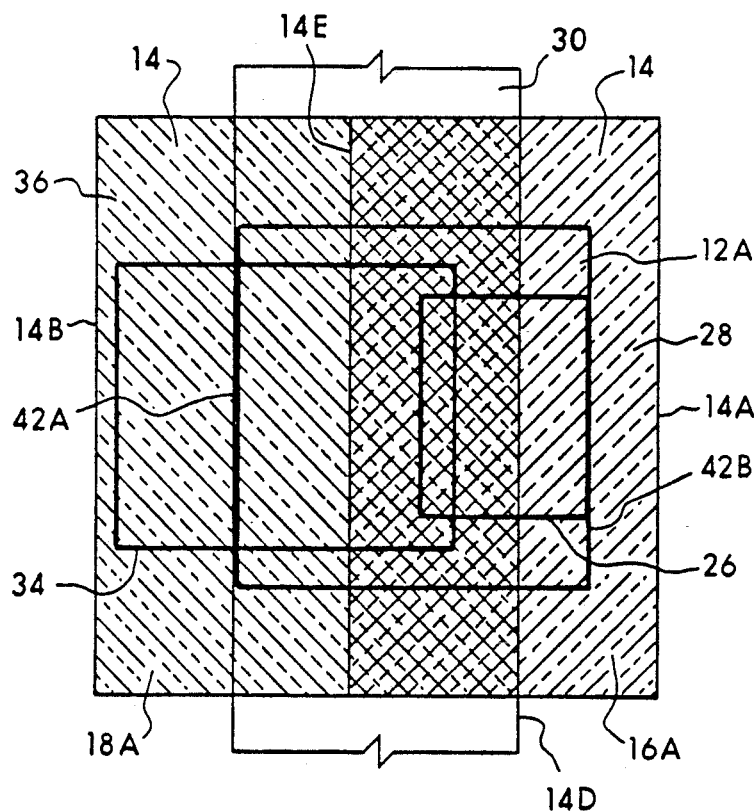
FIG. 7 shows an overhead layout of the wafer of FIG. 6.

Turning briefly to FIGS. 6 and 7, a cross-sectional view and a layout respectively of a semiconductor wafer 10 according to the invention are shown. As can be seen in FIG. 6 the contacts 12A, 12B are close together; in the preferred embodiment the are slightly wider in the horizontal direction than their distance apart. The required width of the landing pad 14 from end 14A to end 14B is determined by the accuracy with which the mask (not shown), which determines the etching of the contact wells in which contacts 12A and 12B are deposited, can be located. With the contacts so close together, the edges of adjacent landing pads, such as 14A and 14C, must be closer together than conventional technology is able to resolve. However, if, in accordance with the invention, the landing pads 14 are fabricated by fabricating a first landing pad member 16A during the fabrication of a first level of semiconductor and then fabricating a second landing pad member 18A during the fabrication of a second semiconducting level, then each member is separated by a larger distance, such as from 14D to 14C, which is easily resolved with conventional technology. The two landing pad members 16A and 18A together form the completed landing pad 14 extending from 14A to 14B.

2. Detailed Description of the Fabrication

Figure 11:
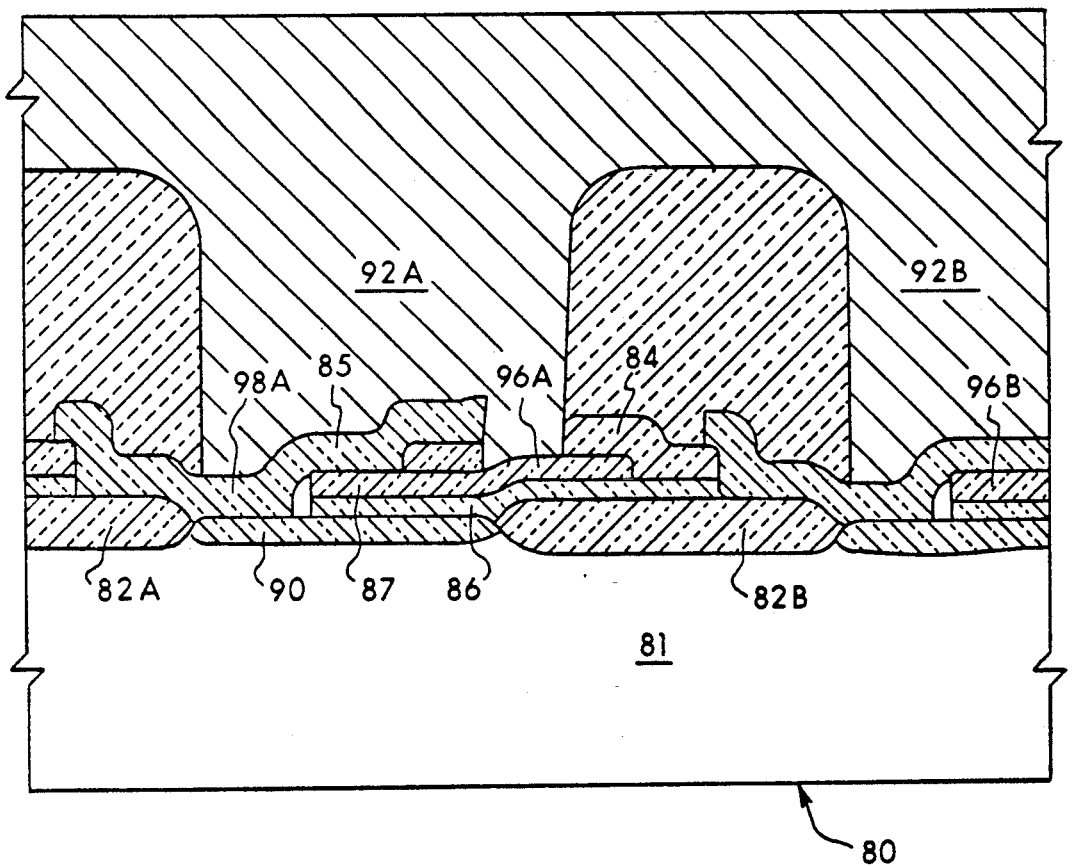
FIG. 11 is a cross-sectional view of a wafer according to a third embodiment of the invention after the contacts have been patterned.

Turning now to a more detailed description of the invention, FIG. 1 shows a cross-section of the wafer 10 in a preliminary stage of fabrication. In the embodiment shown, the device being fabricated is a CMOS SRAM. At this fabrication stage, the standard front end CMOS SRAM processing has been performed, including device isolation and N-channel and P-channel formation. Only the details most relevant to the preferred embodiment of the invention are shown, however, including preferably lightly-doped P-type single crystal silicon substrate 20, insulating layer 22, preferably silicon dioxide, including field oxide regions, such as 22A and 22B, and a thin oxide layer 22C in other areas, and N-type active areas 30. It is noted that the substrate 20 in FIGS. 1 through 6, the substrate 60 in FIGS. 8 through 10, and the substrate 81 in FIG. 11 are not lined for semiconductor. This is done for clarity since the structure of the invention requires that many numbers and lead lines pass through this region, and the lining would make these numbers and lead lines difficult to follow. The nature of such substrates is so well-known in the art that lack of lining will cause no confusion.

Turning to FIG. 2, a number of well-known processes have been performed which have defined an active area 30. In addition, an insulating layer 24, preferably oxide, has deposited and exhumed contacts 26, providing for a contact between the first poly layer 28 and active area 30, have been patterned by conventional deposition, masking, and etching processes. Then a conductive layer 28, preferably of N+-doped polysilicon, which we shall refer to as the first poly layer 28 is deposited. It should be noted that the first poly layer 28 may be what is generally called the poly 2 layer in some SRAM fabrication processes, and what we shall refer to below as the second poly layer may be what is generally called the poly 3 layer in some SRAM fabrication processes. After the first poly layer 28 is deposited, it is patterned by conventional masking and etching processes to form a multitude of first landing pad members, such as 16A and 16B. Oxide layer 24 acts as an etch stop for the first poly 28 etch step. The placement of the right edge 14A of the first poly layer 28 is such that if the contact 12A (FIG. 6) is misaligned to the right, it will still land on the first poly layer 28. In the portion of the wafer 10 shown, the first landing pads, such as 16A and 16B, coincide with the first poly layer 28, though it should be understood that in areas of the wafer 10 not shown, first poly layer 28 may be used to form other electrical components of the SRAM.

In FIG. 3 an interpoly dielectric layer 32, preferably silicon dioxide, has been deposited. Then, as shown in FIG. 4, a second level of exhumed contacts 34 has been patterned by conventional masking and etching processes, and a second conductive layer 36, preferably N+-doped poly, has been deposited. In the preferred embodiment shown, the exhumed contacts 34 are contiguous with both the active area 30 and the first poly layer 28. Second poly layer 36 therefore shorts first poly layer 28 to the active area 30. In FIG. 5, the second poly layer 36 has been patterned by conventional masking and etching processes to form a multitude of second landing pad members, such as 18A and 18B. Interpoly oxide layer 32 acts as an etch stop for the second poly 36 etch step. The placement of the left edge 14B of second landing pad member 18A is such that if the contact 12A (FIG. 6) is misaligned to the left, it will still land on the second poly layer 36. In the portion of the wafer 10 shown, the second landing pads, such as 18A, coincide with the second poly layer 36, though it should be understood that in areas of the wafer 10 not shown, second poly layer 36 may be used to form other electrical components of the SRAM.

Turning to FIG. 5, a contact insulating layer 40, preferably oxide, has been deposited, the contacts 12A and 12B have been patterned by a conventional masking and etching process, and the contact wells filled in by a conducting material, preferably tungsten or aluminum, to form contact element 12 having a multitude of contacts including contacts 12A and 12B. These processes define a contact plane, a plane essentially perpendicular to the contact walls 42A and 42B, that is, a plane that is both horizontal and is perpendicular to the plane of the drawing in FIGS. 1 through 6. This is the plane perpendicular to the direction of the etch that creates the contacts, and may be thought of as a plane in which the contacts such as 12A, meet the landing pads, such as 14. In the above, "essentially" is used because the contact walls 42A and 42B generally will not be exactly parallel.

A layout of the wafer 10 of FIG. 6 is shown in FIG. 7. The layout is placed below FIG. 6 so that the vertical lines defining the outer edges of the various parts in FIG. 7, if extended upward, will coincide with the outer edges of the same parts in FIG. 6. The layout is essentially a projection of the relevant parts of the invention on the contact plane, or a plane parallel to the contact plane. As can be seen from the figure, the area of the first landing pad member 16A projected on the contact plane, which is the area between edges 14A and 14E, is smaller than the area required for a contact landing pad in the integrated circuit, which is the area between edges 14A and 14B; further, the area of the second landing pad member 18A projected on the contact plane, that is, the area between edges 14B and 14D, is smaller than the area required for a contact landing pad in the integrated circuit. It is also evident that the projection of the first landing pad member 16A on the contact plane partially overlaps the projection of the second landing pad member 18A on the contact plane, with the combined projection of both of the landing pad members 16A and 18A on the contact plane is as large as or larger than the area required for a contact landing pad in the integrated circuit.

An alternative preferred embodiment of a wafer 50 according to the invention is shown in FIGS. 8 through 10. FIGS. 8, 9, and 10 correspond to FIGS. 4, 5 and 6 of the embodiment described above. In the embodiment of FIGS. 8, 9, and 10, substrate 60, field oxide regions 62A and 62B, oxide layer 64, and first poly layer 68, are as described for the previously described embodiment. However, the step of etching a second exhumed contact level is omitted, interpoly oxide layer 72 is left essentially undisturbed, and second poly layer 76 is completely insulated from the active area 70 and first poly layer 68. Hence the second landing pad members, such as 58A and 58B, do not electrically contact first landing pad members, such as 56A and 56B, respectively. The second landing pad members, such as 58A and 58B, simply provide an etch stop for the contact etch step. The design of this embodiment ensures that, given any conceivable misalignment of any level or levels, no short between adjacent contacts, such as 52A and 52B, is possible.

A third preferred embodiment of a wafer 80 according to the invention is shown in FIG. 11. FIG. 11 corresponds to FIGS. 6 and 10 of the embodiments described above. In the embodiment of FIG. 11, substrate 81, field oxide regions 82A and 82B, interpoly oxide layer 84, and second poly layer 85, are as described for the embodiment described in relation to FIGS. 1 through 7. However, the step of etching a first exhumed contact level is omitted, first oxide layer 86 is left essentially undisturbed prior to laying down the first poly layer 87, and thus first poly layer 87 is insulated from the active areas, such as 90. Hence the first landing pad members, such as 96A, do not directly contact the active areas, such as 90. The first landing pad members, such as 96A and 96B, provide an etch stop for the contact etch step and provide electrical contact between the right side of the contacts, such as 92A, and the active area 90 via second landing pad member 98A. The design of this embodiment takes less mask steps than the embodiment discussed in relation of FIGS. 1 through 7.

The particular dimensions of the various layers and parts described above can vary widely depending on a wide variety of factors. The nominal size in the preferred embodiment as well as an approximate range for each of the important dimensions are as follows: first landing pads members 16A, 16B, 56A, and 56B are nominally about 0.1 μm thick and may range from about 0.03 μm to about 0.7 μm, and are nominally about 1.0 μm long and may range from about 0.4 μm to about 2.0 μm; second landing pad members 18A, 18B, 58A, and 58B are nominally about 0.1 μm thick and may range from about 0.03 μm to about 0.7 μm, and are nominally about 1.0 μm long and may range from about 0.4 μm to about 2 μm; insulating layers 32, 72 are about 0.2 μm thick and may range from about 0.03 μm to about 0.7 μm. The other dimensions are generally known in the art.

A feature of the invention is that by teaming two different levels to make landing pads, landing pads may be made with conventional technology that would not otherwise be possible to make. A related feature is that contacts can be placed much closer together than they could other wise be placed.

Another feature of the invention is that the tolerances of the various levels and electronic parts need not be as tight as they would have to be without the invention. This can provide considerable cost savings in the fabrication process.

A further feature of the invention is that quantity scrap parts may be significantly reduced with the landing pads of the invention as compared to the prior art. This also results in important cost savings.

There has been described a novel fabrication process and structure which can be utilized to build more compact and better performing integrated circuits and which has many other advantages. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiment described, without departing from the inventive concepts. For example, although the invention was described in terms of a particular application in CMOS SRAMs, it is evident that it has application in other aspects of CMOS SRAM as well as in the fabrication of other circuits and in other semiconductor technologies. It is also evident that the steps recited may often be performed in a different order, or the various structures described may be made with a variety of processes, dimensions, and materials. A greater or lesser number of process steps may be used. Consequently, the invention is to be construed as embracing each and every novel feature and novel combination of features present in and/or possessed by the integrated circuit structure and fabrication process described.

What is claimed is:

1. An integrated circuit structure for an integrated circuit, said integrated circuit having a predetermined minimum size for said contact landing pad, said structure comprising:
   a semiconductor wafer having an active area formed therein;
   a first landing pad member formed in a first layer over said active area, wherein an edge portion of said first landing pad member lies in a first level above said semiconductor wafer;
   a second landing pad member formed in a second layer at least partially over said first landing pad member, wherein an edge portion of said first landing pad member provides a second edge of said contact landing pad and lies in a second level above said semiconductor wafer separated from the first level;
   wherein at least one of said first and second landing pad members electrically contacts said active area, said first landing pad member partially overlaps said second landing pad member, and the combined landing pad area of said first and second landing pad members is at least as large as the predetermined minimum size for a contact landing pad in said integrated circuit.

2. An integrated circuit structure as in claim 1 further comprising a material layer between said first and second landing pad members.

3. An integrated circuit structure as in claim 2 wherein said material layer is a dielectric layer.

4. An integrated circuit structure as in claim 3 wherein said first landing pad member is electrically insulated from said second landing pad member.

5. An integrated circuit structure as in claim 1 further comprising a contact insulating layer formed over the first and second landing pad members, wherein said first and second landing pad members provide an etch stop for an etch of the contact insulating layer.

6. An integrated circuit structure as in claim 3 wherein said second landing pad member electrically contacts said first landing pad member through an opening in said dielectric layer.

7. An integrated circuit structure as in claim 1 wherein said first landing pad member electrically contacts said active area.

8. An integrated circuit structure as in claim 7 wherein said second landing pad member electrically contacts said active area and said first landing pad member.

9. An integrated circuit structure as in claim 1 wherein said second landing pad member electrically contacts said active area.

10. An integrated circuit structure as in claim 9 wherein said second landing pad member also directly contacts said first landing pad member.

11. An integrated circuit structure as in claim 5 wherein said integrated circuit further includes a field oxide layer adjacent said active area, and wherein said first and second landing pad members extend over said field oxide to protect it from damage during the etch of the contact insulating layer.

12. An integrated circuit structure as in claim 11 wherein said field oxide layer includes a first field oxide region on one side of said active area and a second field oxide region on the opposite side of said active area from said first field oxide region, and wherein said first landing pad member extends over said first field oxide region while said second landing pad member extends over said second field oxide region.

13. An integrated circuit structure as in claim 1 wherein said first landing pad member is fabricated from a first layer of doped polysilicon and said second landing pad member is fabricated from a second layer of doped polysilicon.

14. An integrated circuit structure as in claim 13 wherein said integrated circuit further includes a silicon dioxide layer between said first layer of polysilicon and said second layer of polysilicon.

15. A contact structure for an integrated circuit, said integrated circuit having a predetermined minimum size for a contact landing pad, said contact structure comprising:

a semiconductor wafer having an active area formed therein;

a first landing pad member electrically contacting said active area; a second landing pad member partially overlapping said first contact landing pad member; and a conductive contact means positioned on said first and second contact landing pad members for electrically contacting at least one of said first and second landing pad members, wherein the combined landing pad area of said first and second landing pad members is larger than said predetermined minimum size for a contact landing pad in said integrated circuit.

* * * * *

UNITED STATES PATENT AND TRADEMARK OFFICE
CERTIFICATE OF CORRECTION

PATENT NO. : 5,298,792
DATED : March 29, 1994
INVENTOR(S) : Manning

It is certified that error appears in the above-indentified patent and that said Letters Patent is hereby corrected as shown below:

In Column 8, line 15, change "said" (first occurrence) to --a--; and

Signed and Sealed this

Twenty-fourth Day of September, 1996

Attest:

BRUCE LEHMAN

Attesting Officer     Commissioner of Patents and Trademarks